United States Patent [19]

Malaviya et al.

[11] Patent Number: 4,771,328
[45] Date of Patent: Sep. 13, 1988

[54] SEMICONDUCTOR DEVICE AND PROCESS

[75] Inventors: Shashi D. Malaviya, Fishkill; Gurumakonda R. Srinivasan, Poughkeepsie, both of N.Y.

[73] Assignee: International Business Machine Corporation, Armonk, N.Y.

[21] Appl. No.: 931,976

[22] Filed: Nov. 24, 1986

Related U.S. Application Data

[63] Continuation of Ser. No. 541,626, Oct. 13, 1983, abandoned.

[51] Int. Cl.$^4$ .............................................. H01L 27/12
[52] U.S. Cl. ...................................... 357/49; 357/34; 357/50
[58] Field of Search ................. 357/49, 50, 34; 437/67

[56] References Cited

U.S. PATENT DOCUMENTS

| | | | |
|---|---|---|---|
| 3,372,063 | 3/1968 | Suzuki et al. | 148/1.5 |
| 3,500,139 | 3/1970 | Frouin et al. | 357/49 |
| 3,936,858 | 2/1976 | Seeds et al. | 357/23.1 |
| 3,972,754 | 8/1976 | Riseman | 357/50 |
| 4,141,765 | 2/1979 | Druminski et al. | 148/175 |
| 4,196,440 | 4/1980 | Anantha et al. | 357/49 |
| 4,211,582 | 7/1980 | Horng | 357/49 |
| 4,236,294 | 12/1980 | Anantha et al. | 357/49 |
| 4,318,751 | 3/1982 | Horng | 357/50 |
| 4,327,476 | 5/1982 | Iwai et al. | 357/23.6 |
| 4,445,967 | 5/1984 | Kameyama | 357/49 |
| 4,455,740 | 6/1984 | Iwai | 357/55 |
| 4,509,249 | 4/1985 | Goto | 357/49 |
| 4,615,104 | 10/1986 | Kameyama | 357/50 |

OTHER PUBLICATIONS

IBM Technical Disclosure Bulletin by Horng et al., vol. 23, #3, pp. 1034–1035, Aug. 1980.

Primary Examiner—Andrew J. James
Assistant Examiner—Mark Prenty
Attorney, Agent, or Firm—Sughrue, Mion, Zinn, Macpeak & Seas

[57] ABSTRACT

A method of integrated circuit fabrication and the resulting integrated circuit wherein areas of recessed oxide isolation surround active device regions and the bird's head and bird's beak formed during formation of the recessed oxide regions is eliminated by forming a deep dielectric isolation trench directly over the bird's head. A very thin epitaxial layer can be provided over the active device regions of the integrated circuit. Preferably, the thin epitaxial layer is selectively grown only over active device regions. Also, in later manufacturing steps, metal is deposited in direct registration with contact areas.

2 Claims, 2 Drawing Sheets

SEMICONDUCTOR DEVICE AND PROCESS

This is a continuation of application Ser. No. 541,626, filed Oct. 13, 1983, and now abandoned.

BACKGROUND OF THE INVENTION

The present invention relates to high performance semiconductor devices. The increasing microminiaturization of semiconductor integrated circuits has raised lateral semiconductor device density. In turn, this has led to the utilization of lateral electrical isolation. However, many prior art procedures involving recessed oxide isolation provide etched recesses widest at the surface and which tend to taper inwardly, providing a narrowing lateral isolation area with increasing depth, thereby using up an unacceptable width of wafer surface to provide adequate deep electrical isolation.

U.S. Pat. No. 3,972,754 by Riseman describes a process for forming dielectrically isolated regions in a silicon semiconductor substrate in which a recessed silicon dioxide area is formed extending into the substrate using a photolithographic process followed by etching and thermal oxidation. Thereafter, blanket introduction of impurities of conductivity opposite to the conductivity of the silicon substrate surface is carried out into the portions of the substrate surface remaining unoxidized. Then, a layer of opposite-type conductivity is epitaxially deposited (a selective epitaxial process where the epitaxial layer is provided over selective areas of the wafer surface is preferred to improve device density and performance) on the substrate surface. In the art, it is known that the wafer surface must be made more planar prior to growing the epitaxial layer. In particular, the small hump formed where oxide penetrates between the mask used in the photolithographic process and the substrate (the "bird's head" and "bird's beak") must be removed by a planarization technique or the formation thereof prevented by sidewall capping, such as by a layer of nitride. In the remainder of the U.S. Pat. No. 3,972,754 process, regions of recessed oxide are formed extending through the epitaxial layer into registered contact with the regions of recessed silicon dioxide formed in the substrate. Although the U.S. Pat. No. 3,972,754 process provides deep dielectric isolation, the oxide hump formation problem remains and, in addition, the process becomes more complicated because of the need for a second recessed oxide isolation. Indeed, due to normal mask tolerances, it is essentially impossible to perfectly align a second recess directly over a first recess. Furthermore, the epitaxial layer is relatively thick, for example, 2 to 4 microns, which in turn decreases device speed. Thus, the presence of the oxide hump adversely affects planarity, lowers the density of the circuit and, in general, slows device performance.

In addition, problems have developed in overall prior art procedures regarding the alignment of deposited metal with device contact areas. Device reliability and density suffer where a contact is not completely covered by metal and/or where, due to misalignment, it is necessary to provide an area of metal larger than contact area.

SUMMARY OF THE INVENTION

Accordingly, it is an object of the present invention to provide a method of integrated circuit fabrication which utilizes recessed silicon dioxide regions together with deep dielectric isolation which is centered on the "bird's head" wherein lateral device densities are increased.

A further object of the present invention is to provide a method for integrated circuit fabrication in which a relatively thin epitaxial layer can be used.

Another object of the present invention is to provide a method for integrated circuit fabrication wherein the overall electrical performance of the integrated circuit is improved by increasing device speed.

Yet another object of the present invention is to self-align metal over device contacts and to reduce the metal-to-metal spacing between these contacts to submicron dimensions independent of photolithographic tolerances.

Another object of the present invention is to provide a process wherein the epitaxial areas can be selectively grown only over active device regions in an integrated circuit manufacturing process.

Other objects of the present invention involve the provision of integrated circuits produced in accordance with the manufacturing embodiments of the present invention. Furthermore, additional objects of this invention will be apparent to the skilled artisan from the detailed description of the invention, hereinafter.

In accordance with the present invention, there is provided a method for making a semiconductor device comprising the steps of:

forming a patterned mask, typically consisting of thin layers of thermally grown silicon oxide and silicon nitride, on a semiconductor substrate with the pattern of said patterned mask defining a region for forming recessed oxide isolation surrounding an active device region;

etching said semiconductor substrate within said pattern, typically by using anisotropic reactive ion etching (RIE), to form a recess in said semiconductor substrate in accordance with said pattern;

filling said recess with thermally grown oxide to about the level of said mask, oxide also penetrating between said mask and substrate to form a hump which consists of the bird's head of oxide adjacent to the mask edge and bird's beak of oxide beneath said mask over a portion of said active device region;

forming a deep dielectric isolation trench adjacent said recessed oxide isolation through said bird's head;

forming a region of doped material of the same type of conductivity as the substrate beneath the region of deep dielectric isolation; and filling said deep dielectric isolation trench with dielectric material.

In a preferred embodiment of the invention, after the completion of the above process, a thin epitaxial layer is provided over the remainder of the active device region. In a more preferred embodiment, the thin epitaxial layer is selectively grown over the active device region.

In the product embodiments of this invention, there is provided a semiconductor device structure comprising a semiconductor substrate, an active device region formed within said substrate, a region of recessed oxide isolation surrounding said active device region within said substrate and a region of deep dielectric isolation formed between said recessed oxide isolation region and said active device region and extending into said substrate to a depth lower than the depth of said recessed oxide isolation region and below the depth of said active device region.

Other embodiments of the invention will be apparent from the detailed description of the invention hereinbelow.

DETAILED DESCRIPTION OF THE INVENTION

Figure 1:
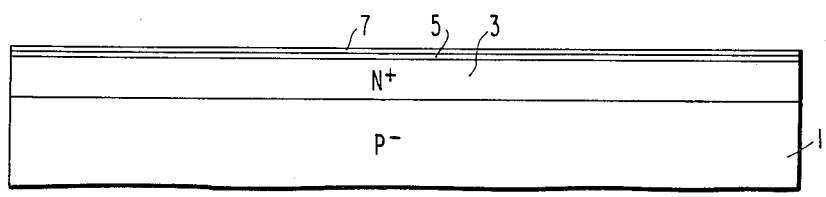
FIGS. 1-10 of the drawing are diagrammatic sectional views of an integrated circuit to illustrate the method and integrated circuitry of the present invention.

FIGS. 1-10, in total, illustrate a preferred embodiment of the present invention. First considering FIG. 1, on a suitable semiconductor wafer 1, P−, having a resistivity, for example, of 10 ohm-cm, a blanket introduction of impurities across the surface is carried out to form what will be buried regions of N+ subcollector layer 3. The blanket introduction of impurities to form N+ subcollector layer 3 may be carried out by conventional thermal diffusion of impurities such as phosphorus, arsenic, antimony or the like to a surface concentration of, for example, $10^{21}$ atoms/cm$^3$. Alternatively, N+ layer 3 may be formed utilizing conventional ion implantation techniques for the introduction of N-type impurities.

It should be noted that the structure being shown in the drawing and described herein is only a small portion of an integrated circuit, intended to illustrate the operability of the present invention.

Figure 2:
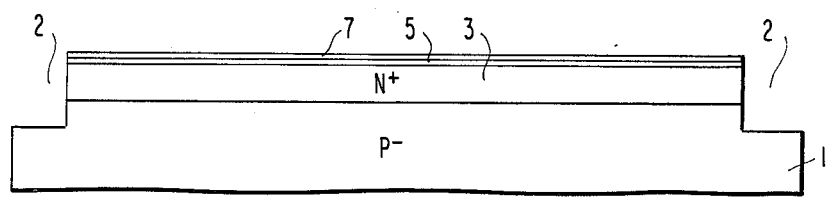

Next, a composite mask comprising a silicon dioxide lower layer 5 and a silicon nitride upper layer 7 is formed in the conventional manner known in the recessed silicon dioxide art. For example, silicon dioxide layer 5 can be thermally grown to a thickness of about 1000 angstroms in the conventional manner. Next, silicon nitride layer 7 is formed by any conventional technique such as the chemical vapor deposition reaction of silane and ammonia. Alternatively, silicon nitride layer 7 may be deposited by conventional RF sputter deposition techniques. Then, utilizing conventional photolithographic etching techniques, openings 2 as shown in FIG. 2 are etched through all three layers 3, 5 and 7 and into the silicon substrate 1. One way to accomplish this is to use standard photolithography techniques to define openings 2 and then to use directional RIE, such as by using CF$_4$, to etch almost vertically through the layers 7, 5, 3 and 1 to the desired depth, typically about 0.4$\mu$ in the silicon layer 1.

Figure 3:
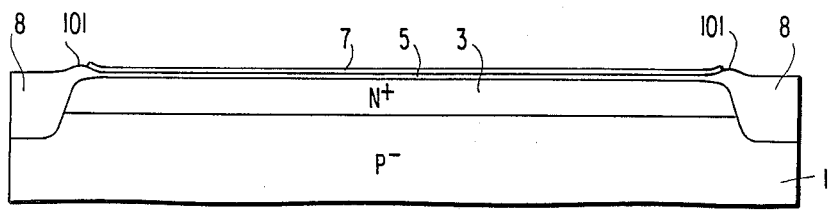

The structure is then put through an oxidation cycle wherein it can be placed in an oxidation atmosphere at an elevated temperature, of the order of 973°-1100° C., with addition of water to produce silicon dioxide recessed regions 8 as shown in FIG. 3. The oxidation can be continued until regions 8 extend into substrate 1 (including layer 3) for a distance of the order of 1.0 microns from the surface. The composite masking structure 5 and 7 can now be removed from the surface of layer 3 in a conventional manner, providing the structure of FIG. 4. However, as will soon be obvious, it is preferable not to remove these two layers at this stage. As an overall alternative method, if subcollector region 3 had not been formed initially, it could be formed at this time in the manner as aforedescribed, with the exercise of care not to drive region 3 into the substrate beyond the depth of recessed oxide regions 8, bearing in mind subsequent high heat cycle steps.

Figure 4:
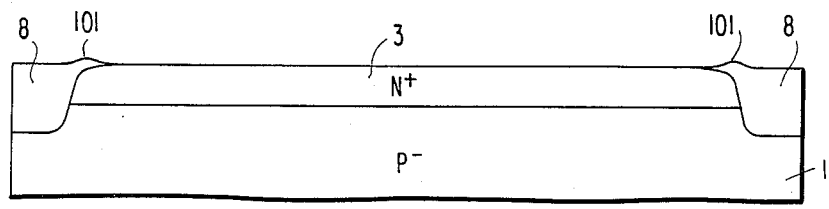

In the process up to this point, the hump is formed of oxide particles at area 101 on the surface of the wafer, as shown in FIGS. 3 and 4.

Figure 5:
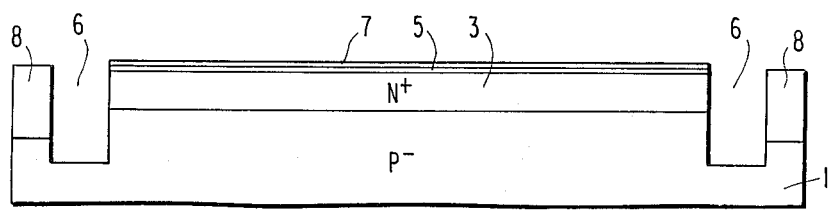
Figure 6:
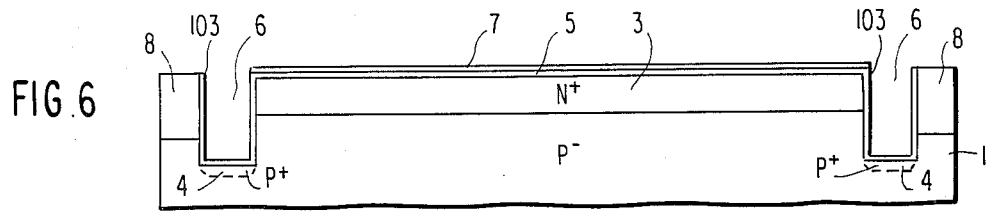
Figure 7:
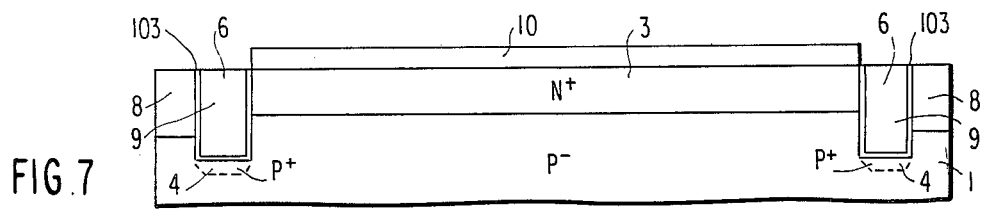

To eliminate the oxide hump and provide adequate lateral electrical isolation, deep trenches 6, as shown in FIG. 5, are formed directly over the bird's head. Trenches 6 are formed adjacent the recessed oxide isolation regions 8 by using a new layer of CVD oxide or SiO$_2$ (not shown) as a mask onto which the trench patterns are first transferred from a photoresist mask by using CF$_4$ directonal RIE. The photoresist is then stripped and the CVD oxide or SiO$_2$ is used as the mask to RIE vertical walls of trenches 6 extending up from within P-substrate 1. The bottom of the trench is typically about 1.0$\mu$ below the bottom of the N+ collector layer 3. The gas used for RIE can be SF$_6$/Cl$_2$. Most of the CVD or SiO$_2$ masking layer is consumed during the RIE process. The remainder is removed by switching back to CF$_4$ RIE. After the formation of trenches 6, but prior to removal of silicon dioxide 5 and silicon nitride 7 masking layers masking the active device regions, the wafer is optionally thermally oxidized at about 1100° C. to form an oxide layer 103 of about 100 to 1000 angstrom thickness along the sidewalls and bottom of trenches 6 to passivate the silicon. A dopant such as boron can then be ion implanted into the bottom of the trench through the oxide layer 103 for P− isolation (region 4 in FIG. 6). The silicon dioxide and silicon nitride composite mask acts to prevent boron implantation into active device regions.

A chemical vapor deposition process is carried out to overfill trenches 6 with silicon dioxide, or other dielectric material, followed by planarizing such as by coating the entire surface with a film of photoresist or polyamide, or the like, and carrying out a blanket RIE with 1:1 etch rate ratio between the oxide and the photoresist until the nitride layer 7 is reached. In this manner, the wafer surface is planarized while the trench 6 is filled with oxide 9.

Thereafter, the silicon nitride layer 7 is removed by chemical etching using, for example, 15 seconds of dip etch in 7:1 buffered etcher:HF, followed by hot phosphoric acid etch at 165° C. This exposes silicon dioxide layer 5 covering active device regions.

Next, an epitaxial layer is to be grown, either over the entire wafer surface, or only over active device regions.

Prior to growing the epitaxial layer 10, oxide layer 5 is chemically etched using buffered etcher to expose N+ layer 3 over the active device regions. The N− epitaxial layer, for example, having a maximum impurity concentration or doping level of about 1 to $3 \times 10^{16}$ atoms/cm$^3$ can be formed using conventional epitaxial techniques at a temperature of the order of 950°-1150° C. If the epitaxial layer is formed over the entire wafer surface, it will be polycrystalline silicon over the oxide areas 6 and 8 and monocrystalline silicon over N+ layer 3. A masking technique can be used to etch out the polycrystalline silicon over the oxide layers 8 and 9. Alternatively, to remove the polycrystalline silicon over the oxide layers, a thin layer of arsenic or phosphorus can be deposited by ion implantation and driven in into the bulk of the polysilicon by a suitable heat cycle. The out diffusion rate into the polycrystalline silicon region is about 10 times faster than in single crystal silicon and therefore the impurity spreads out into the bulk of the polysilicon but remains confined to a thin surface layer of the single crystal silicon. Thereafer, the N+ polysilicon layer is chemically etched by using a solvent which etches the N+ silicon very fast but not the undoped silicon. Only a thin top layer will be lost from the active device layer, but the entire polycrystalline silicon regions will be removed from the inactive device area. In some cases it may be preferable to use P+ dopant, such as boron, instead of N+ dopant, to selectively etch away the doped polysilicon.

Alternately and preferably, the epitaxial layer 10 is selectively grown only over the active device regions, with no growth over oxide regions 8 by conventional techniques such as SiCl$_4$ epitaxy. In either case, epitaxial layer 10 results which is coextensive with N+ layer 3. See FIG. 7. In the process of this invention, the epitaxial layer can be relatively thin, i.e., of the order of only 0.6 microns, since it is grown after the primary heat cycles have been completed and the subsequent emitter heat cycle can be made small through the use of a shallow emitter.

Figure 8:
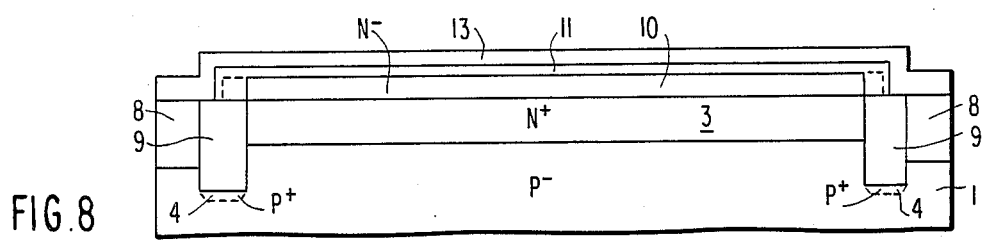

The remaining steps set forth below involve preferred modes for further processing in accordance with the present invention, with reference to FIGS. 8, 9 and 10.

Thermal silicon dioxide layer 11, about 1000 angstroms thick, is then grown on epitaxial layer 10, and thereafter a silicon nitride layer 13 about equal in thickness to that of the oxide is deposited thereon. In a preferred mode, a thinner oxide layer of about 300–500 angstroms in thickness is used. See FIG. 8.

Figure 9:
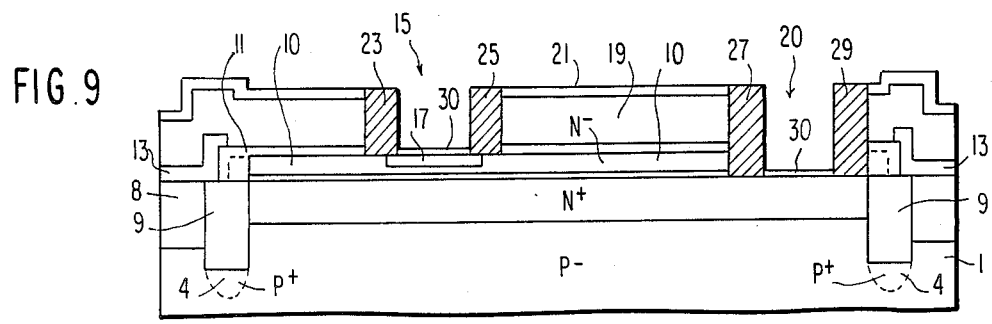
Figure 10:
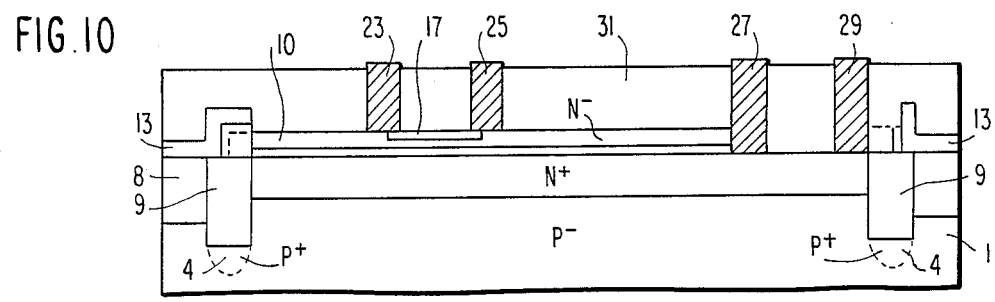

With respect to FIG. 9, a base window is etched into nitride layer 13 and then boron is implanted into epitaxial layer 10 to form base region 17. Thereafter, polycrystalline silicon layer 19 is formed by chemical vapor deposition to about a thickness of 9000 angstroms, and that layer is optionally doped N+ by ion implantation. A thin silicon nitride layer 21 is then deposited by chemical vapor deposition over the polycrystalline silicon layer. Through the use of photoresist and reactive ion etching, the emitter and collector openings are formed as shown at 15 and 20 in FIG. 9. In this regard, the emitter opening may be blocked after etching proceeds to the top surface of the epitaxial layer 10 and the RIE can then be resumed to permit the reactive ion etching process to etch down to N+ region 3 in the collector window 20 so as to form the collector opening. Thereafter, the photoresist is stripped.

Next, a silicon dioxide layer about 6000–8000 angstroms thick is formed by chemical vapor deposition and through reactive ion etching, this layer is etched back the same amount to form sidewall studs of silicon dioxide 23 and 25 around the emitter opening and sidewall studs of silicon dioxide 27 and 29 around the collector opening, as shown in FIG. 9. Another photomasking step is used to etch away unwanted portions of the sidewall studs. A layer 30 approximately 250 angstroms thick (for a screen) is then grown, through thermal oxidation, in the emitter and collector openings.

Thereafter, the emitter region is implanted with arsenic and the dopant is driven in, and then silicon nitride layer 21 is chemically etched to expose polycrystalline silicon layer 19. The polycrystalline silicon layer 19 is, in turn, chemically etched using pyrocathical or any other suitable chemical. Then, the oxide layers 30 and 11 over the contacts are etched and platinum is deposited, sintered, and so forth. This first level metallurgical process can be continued in conventional fashion using a lift-off process typically employed and the device can be planarized with metal 31 to the stud level as shown in FIG. 10. Details of this process are available in patent application Ser. No. 167,184, filed July 8, 1980 by Goth, Magdo and Malaviya, entitled "Self-aligned Metal Process for Integrated Circuit Metallization."

While the invention has been particularly shown and described with reference to preferred embodiments thereof, it will be understood by those skilled in the art that various changes in form and details may be made therein without departing from the spirit and scope of the invention.

We claim:

1. An integrated circuit comprising a semiconductor substrate; a subcollector region formed within said substrate; a region of recessed oxide isolation extending into the substrate below the depth of and surrounding said subcollector region; a region of deep dielectric isolation defined by substantially vertical, co-extensive, parallel side walls and a bottom wall formed between and adjacent both said recessed oxide isolation region and said subcollector region, said deep dielectric isolation being comprised of a thin liner of thermal silicon oxide surrounding an inner region of dielectric material and being in an abutting relation to said subcollector region and extending into said substrate to a depth lower than the depth of said recessed oxide isolation region and below the depth of said subcollector region, and a thin epitaxial layer over said subcollector region and being higher than said region of deep dielectric isolation, said thin epitaxial layer having been formed after said recessed oxide isolation and deep dielectric isolation regions, whereby said subcollector region does not substantially diffuse into said thin epitaxial layer.

2. The semiconductor device of claim 1, wherein a region of doped material having a conductivity the same as that of the substrate is present beneath the region of deep dielectric isolation.

* * * * *